United States Patent
Benveniste

Patent Number: 5,814,823
Date of Patent: Sep. 29, 1998

[54] SYSTEM AND METHOD FOR SETECING NEUTRAL PARTICLES IN AN ION BEAN

[75] Inventor: Victor M. Benveniste, Gloucester, Mass.

[73] Assignee: Eaton Corporation, Cleveland, Ohio

[21] Appl. No.: 900,379

[22] Filed: Jul. 12, 1997

[51] Int. Cl.⁶ .................................................. H01J 39/00
[52] U.S. Cl. ..................................... 250/492.21; 250/397
[58] Field of Search ............................. 250/492.21, 397, 250/251

[56] References Cited

U.S. PATENT DOCUMENTS

| | | | |
|---|---|---|---|
| 4,587,433 | 5/1986 | Farley | 250/492.2 |
| 4,717,829 | 1/1988 | Turner | 250/492.2 |
| 4,751,393 | 6/1988 | Corey, Jr. et al. | 250/492.21 |
| 4,929,840 | 5/1990 | Dykstra et al. | 250/492.3 |
| 5,136,171 | 8/1992 | Leung et al. | 250/492.2 |
| 5,572,038 | 11/1996 | Sheng et al. | 250/492.21 |
| 5,631,461 | 5/1997 | Swenson | 250/397 |

Primary Examiner—Kiet T. Nguyen
Attorney, Agent, or Firm—John A. Kastelic

[57] ABSTRACT

An improved neutral particle detector (52) for an ion implantation system (10) is provided for detecting the neutral particle content of an ion beam (28) which is comprised primarily of neutral particles and positively charged ions. The neutral particle detector (52) comprises (i) a deflector plate (78) residing at a negative electrical potential; (ii) a first collecting electrode (82) residing at a positive electrical potential with respect to said deflector plate (78) for collecting secondary electrons emitted by the deflector plate (78) as a result of neutral particles in the ion beam impacting the deflector plate (78); and (iii) a second collecting electrode (84) residing at a positive electrical potential with respect to said deflector plate (78) for collecting secondary electrons emitted by the deflector plate (78) as a result of positively charged ions in the ion beam impacting the deflector plate (78). The deflector plate (78) and the collecting electrodes (82, 84) are separated by a distance through which the ion beam passes. The neutral particle detector (52) determines the neutral particle fraction of the ion beam independent of the composition or pressure of the residual background gas through which the ion beam propagates.

20 Claims, 2 Drawing Sheets

SYSTEM AND METHOD FOR SETECING NEUTRAL PARTICLES IN AN ION BEAN

FIELD OF THE INVENTION

The present invention relates generally to the field of ion implanters, and more specifically to an improved system and method for monitoring and controlling the dopant concentration of an implanted substrate by detecting neutral particles in the ion beam.

BACKGROUND OF THE INVENTION

Ion implantation has become the technology preferred by industry to dope semiconductors with impurities in the large scale manufacture of integrated circuits. Ion energy and ion dose are the two most important variables used to define an implant step. Ion energy is used to control junction depth in semiconductor devices. The energy levels of the ions which make up the ion beam determine the degree of depth of the implanted ions. Ion dose relates to the concentration of implanted ions for a given semiconductor material. Typically, high current implanters (generally greater than 10 milliamps (mA) ion beam current) are used for high dose implants, while medium current implanters (generally capable of up to about 1 mA beam current) are used for lower dose applications.

A typical ion implanter comprises three sections or subsystems: (i) a terminal for outputting an ion beam, (ii) a beamline for mass resolving and adjusting the focus and energy level of the ion beam, and (iii) a target chamber which contains the semiconductor wafer or other substrate to be implanted by the ion beam. The target chamber typically includes a dosage control or dosimetry system which functions to accurately measure and control the dosage of ions which are implanted into the target wafer.

Dosage control systems often include a device for measuring beam current, because dopant dosage is directly related to beam current. A device such as a Faraday cage is typically used to measure beam current. Faraday cages measure beam current by trapping and measuring the charged ions in the beam while blocking electrons from entering or escaping the cage.

While charged particles can be suitably accounted for, neutral atoms in the beams present a more difficult problem because they are not detected by the Faraday cage and therefore do not contribute to the measured beam current. Thus, neutral atoms in the ion beam are not considered when calculating a total dosage based on the Faraday cage measurements. Because neutral atoms may have essentially the same energy as ions, however, they are implanted into the wafer and contribute to the total dopant concentration. If significant neutralization of the beam occurs, the Faraday cage will provide a false measure of the true implanted dosage of the substrate.

The extent of neutralization of the beam depends in part upon the pressure within the beamline. If the beamline vacuum pressure is sufficiently low, the implanted species is ideally a singly charged positive ion of the particle which is selected by the mass analysis magnet. If the pressure is not sufficiently low, however, the ions in the beam may change charge state through atomic collisions with the residual background gas atoms, without undergoing a significant change in energy. In addition, the extent of beam neutralization also depends on the composition of the residual background gas through which the ion beam propagates. Neutralization of the beam is particularly problematic when implanting semiconductor surfaces such as photoresists, which tend to outgas or sputter, thereby altering the composition of the residual background gas. In either case, the beam striking the Faraday cage may be sufficiently neutralized so as to possess a considerable fraction of atoms of enough energy to be implanted into the substrate, yet not be counted by the Faraday cage as part of the total beam flux, which includes both charged ions and neutral particles.

One manner of monitoring the dosage of atoms being implanted into a substrate (i.e., dosimetry control) which compensates for beam neutralization tendencies is shown in U.S. Pat. No. 4,539,217 to Farley, which is commonly owned by the assignee of the present invention and incorporated by reference as if fully set forth herein. Farley automatically compensates for implanted ions which have been neutralized by interactions with gas atoms in the flight path to the wafer being implanted. Compensation is based on the fact that the collisions of the primary positive ion beam with gas atoms along its path causes electrons to be added to or taken away from some of the singly charged positive ions with a probability which can be scientifically determined. The probability depends upon, and is a function of, the ion species, the ion velocities (energies), and the composition and pressure of the residual background gas through which the ion beam passes.

By measuring these parameters, the determination of implanted dosage, which is primarily based on the Faraday cage beam current measurement, may corrected to account for neutral particles. The dosage measurement is compensated upwards (to prevent overdosing) based on a determination of the extent of ion beam neutralization, which does not contribute to the Faraday cage beam current measurement yet which does contribute to dosage. The dosage measurement is compensated downwards (to prevent underdosing) based on a determination of the extent of doubly charged ions, which only contribute to dosage as much as singly charged ions yet which are counted twice by the Faraday cage as contributing to ion beam current.

Farley assumes that over a wide range of pressures encountered in the beamlines of implantation devices, the function is essentially linear. A single measurement of pressure at a particular point in the beam is taken and assumptions are made regarding a pressure path integral along the beam. Based on the assumption, partial pressure components for each location in the beams may be determined. A measurement of the ion beam current from a Faraday cage versus pressure is thereby input into the implanter control system to generate a correction signal which compensates for the change in detected neutral particles as the pressure varies. This process, known in the art as pressure compensation, allows the implantation dose to be accurately monitored and controlled.

However, the pressure compensation technique used in dosage control systems is flawed in that assumptions regarding both the pressure and the composition of the residual background gas may change during the implantation process. For example, the composition of the residual background gas may change due to a vacuum leak. In addition, the calibration of a pressure gauge used to measure the pressure at a particular point in the beam may drift. Further, the pressure distribution along the beam may change due to variations in vacuum pumping speeds or from outgassing or sputtering rates from the substrate being implanted. Still further, both pressure and residual background gas composition are made difficult to measure by outgassing of photoresist from the substrate being implanted, which contributes hydrogen and water to the residual background gas. Moreover, even if the exact pressure and composition of residual background gas could be determined using the pressure compensation technique, the process must be repeatedly performed for each species and energy of gas particle being implanted.

Accordingly, it is an object of the present invention to provide a more direct measurement of the fraction of the ion beam which has been neutralized during propagation along a beamline, prior to impact with a target substrate.

It is a further object of the invention to provide a direct measurement of the fraction of the ion beam which has been doubly charged during its propagation along the beamline.

It is still a further object of the invention to measure the extent of ion beam neutralization and double charging in an ion implantation system using a known beam current measurement mechanism such as a Faraday cage.

It is yet a further object of the invention to provide a system and method of measuring the extent of ion beam neutralization and double charging in an ion beam which does not require direct pressure measurements, or an analysis of the composition of the residual background gas through which the ion beam propagates.

SUMMARY OF THE INVENTION

An improved neutral particle detector for an ion implantation system is provided for detecting the neutral particle content of an ion beam which is comprised primarily of neutral particles and positively charged ions. The neutral particle detector comprises (i) a deflector plate residing at a negative electrical potential; (ii) a first collecting electrode residing at a positive electrical potential with respect to the deflector plate for collecting secondary electrons emitted by the deflector plate as a result of neutral particles in the ion beam impacting the deflector plate; and (iii) a second collecting electrode residing at a positive electrical potential with respect to the deflector plate for collecting secondary electrons emitted by the deflector plate as a result of positively charged ions in the ion beam impacting the deflector plate. The deflector plate and the collecting electrodes are separated by a distance through which the ion beam passes. The neutral particle detector determines the neutral particle fraction of the ion beam independent of the composition or pressure of the residual background gas through which the ion beam propagates.

DETAILED DESCRIPTION OF A PREFERRED EMBODIMENT

Figure 1:
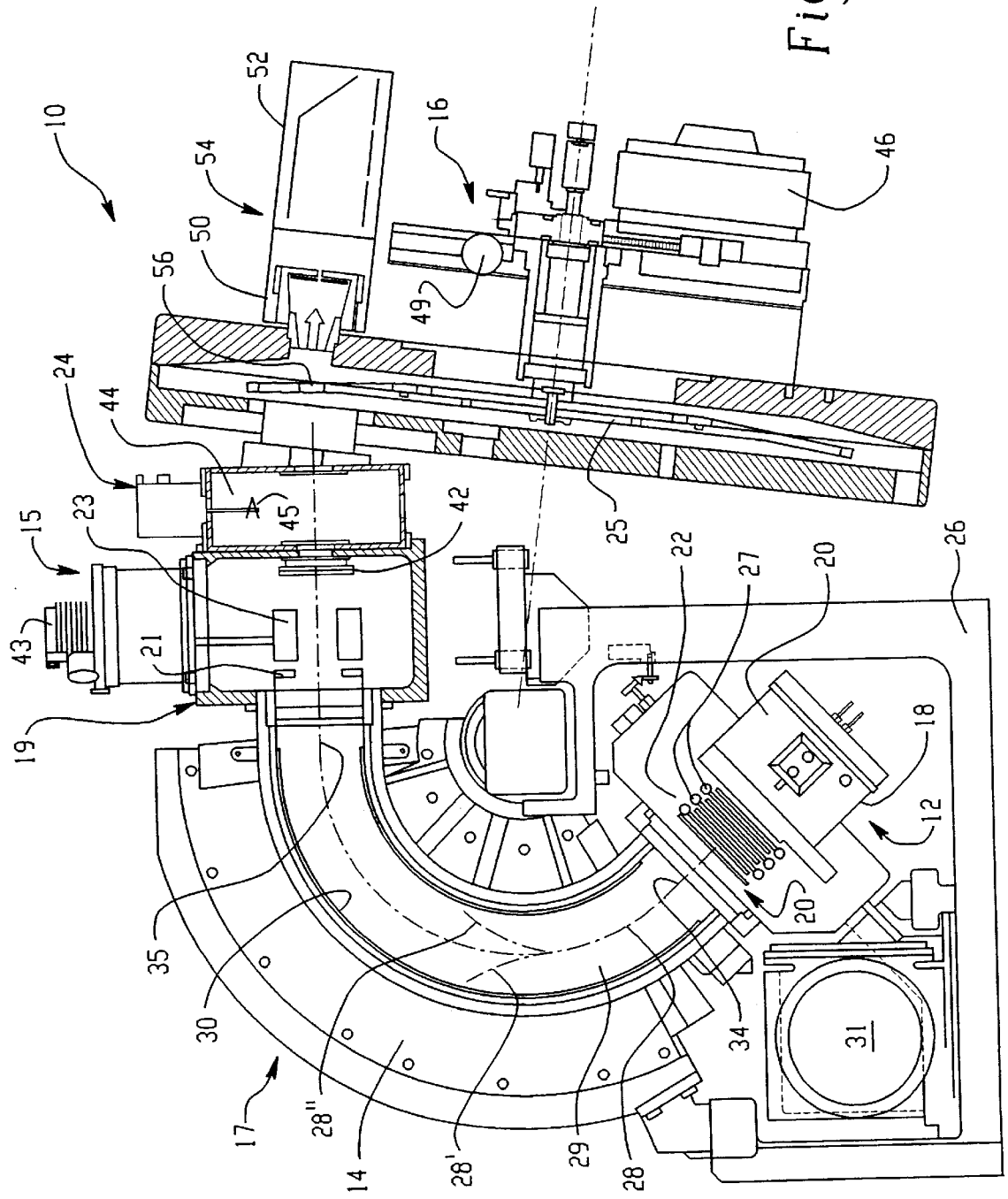
FIG. 1 is a perspective view of an ion implantation system into which is incorporated one embodiment of a dosimetry control system constructed according to the principles of the present invention.

Referring now to the drawings, FIG. 1 discloses an ion implanter, generally designated 10, which comprises an ion source 12, a mass analysis magnet 14, a beamline assembly 15, and a target or end station 16. The ion source 12 and the mass analysis magnet 14, along with their respective power supplies, are collectively referred to as a terminal 17. One application of the present invention is in a low energy implanter, such as that shown in FIG. 1, wherein the beamline assembly 15 is relatively short due to the tendency of a low energy beam to expand (i.e., "blow-up") during propagation thereof. The invention, however, has applications in any implantation system in which dosimetry control is utilized.

The ion source 12 comprises a housing 18 which defines a plasma chamber 20, and an ion extractor assembly 22. The beamline assembly 15 includes (i) a resolver housing 19 which is evacuated by vacuum pump 43 and which contains a terminal aperture 21, a resolving aperture 23, and a flag Faraday 42, and (ii) a beam neutralizer 24 which contains an electron shower 45, none of which form a part of the present invention. Downstream of the beam neutralizer 24 is the end station 16, which includes a disk-shaped wafer support 25 upon which wafers to be treated are mounted. As used herein, wafer shall include any type of substrate which may be implanted with an ion beam. The wafer support 25 resides in a target plane which is (generally) perpendicularly orientated to the direction of the implant beam.

The ion source 12 is mounted to an L-shaped frame 26. Ionizable dopant gas, which is obtained either directly in the form of a compressed gas or indirectly from a solid form which has been vaporized, is injected into the plasma chamber 20. Typical source elements are boron (B), phosphorous (P), gallium (Ga), indium (In), antimony (Sb), and arsenic (As). Most of these source elements are provided in solid form, except boron, which is typically provided in the form of gaseous boron trifluoride or diborane.

Energy is imparted to the ionizable dopant gas to generate ions within the plasma chamber 20. Generally, positive ions are generated, although the present invention is applicable to systems wherein negative ions are generated by the source. The positive ions are extracted through a slit in the plasma chamber 20 by the ion extractor assembly 22 which comprises a plurality of electrodes 27. Accordingly, the ion extractor assembly functions to extract a beam 28 of positive ions from the plasma chamber and accelerate the extracted ions into the mass analysis magnet 14 which is supported by frame 26.

The mass analysis magnet 14 functions to pass only ions of an appropriate charge-to-mass ratio to the beamline assembly 15. The mass analysis magnet 14 includes a curved beam path 29 which is defined by an aluminum beam guide 30, evacuation of which is provided by vacuum pumps 31 and 43. The ion beam 28 which propagates along this path is affected by the magnetic field generated by the mass analysis magnet 14. The magnetic field causes the ion beam 28 to move along the curved beam path 29, from a first or entrance trajectory 34 near the ion source 12 to a second or exit trajectory 35 near the resolving housing 19. Portions 28' and 28" of the beam 28 comprised of ions having an inappropriate charge-to-mass ratio are deflected away from the curved trajectory and into the walls of aluminum beam guide 30. In this manner, the magnet 14 passes to the beamline assembly 15 only those ions in the beam 28 which have the desired charge-to-mass ratio.

The disc shaped wafer support 25 at the end station 16 is rotated by motor 46. The ion beam thus strikes wafers mounted to the support as they move in a circular path. The end station 16 is pivotable about two axes: one which is normal to the path of the ion beam and one which crosses the nominal beam-target intersection. In this manner, the angle of ion implantation may be slightly modified from the normal. As is known in the art, the disk shaped support 25 is rotated at a constant angular velocity by motor 47, and support 25 is moved vertically (into and out of the page of FIG. 1) by motor 49 and a lead screw (not shown).

The rate at which the lead screw moves the support vertically is determined by a calculation of implanted dosage as (i) measured by a beam current measurement device such as a Faraday cage 50 and (ii) corrected by a factor determined using a neutral particle detector 52 constructed according to the principles of the present invention. In the disclosed embodiment, the Faraday cage 50 and the neutral particle detector 52 together comprise a measurement/detection assembly 54.

Figure 2:
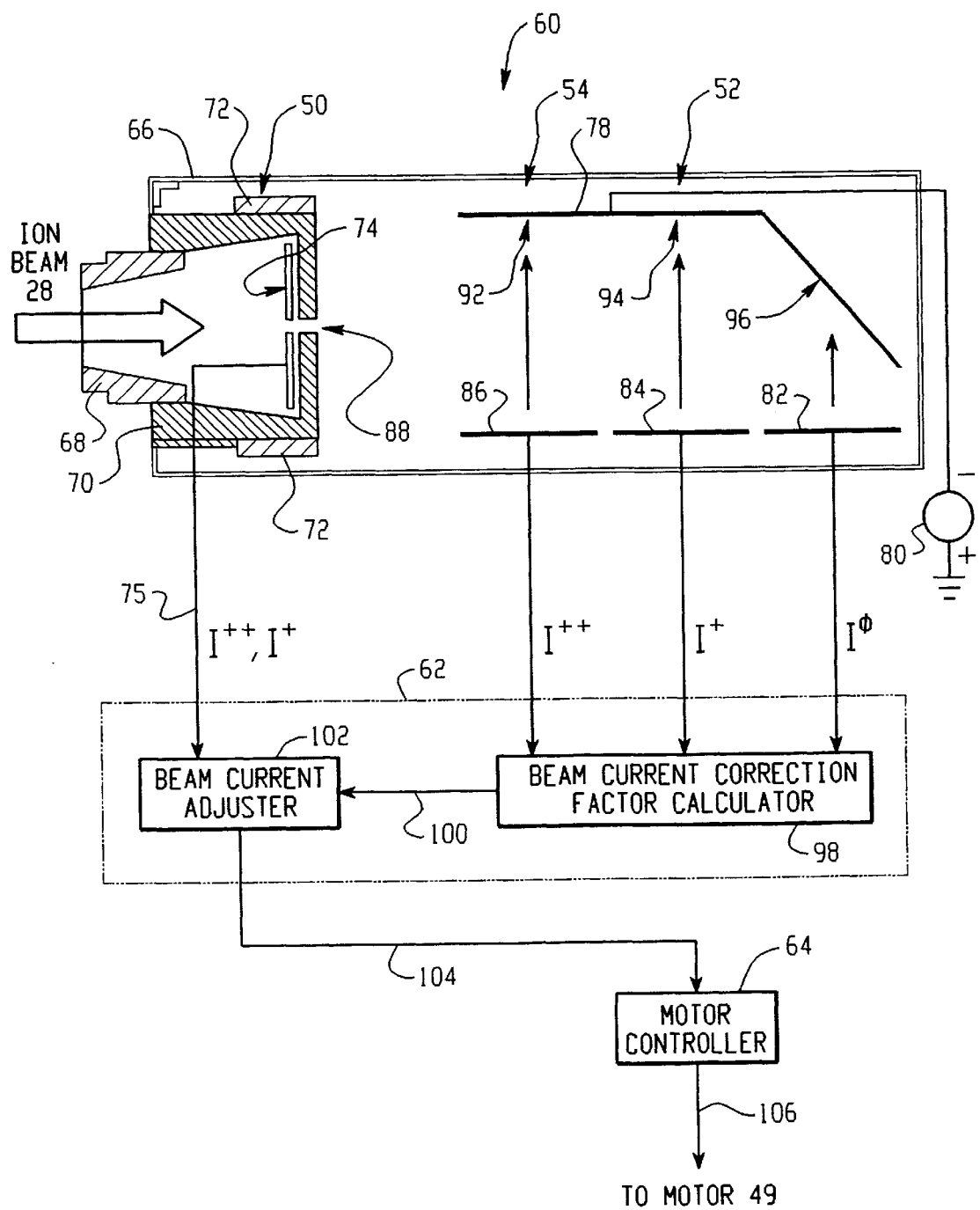
FIG. 2 is a sectional view of the dosimetry control system of the system of FIG. 1.

FIG. 2 shows a dosimetry control system 60, which is constructed according to the principles of the present invention and incorporated into the system 10 of FIG. 1. The dosimetry control system 60 comprises (i) the measurement/detection assembly 54, which is comprised of the Faraday cage 50 and the neutral particle detector 52 surrounded by enclosure 66, (ii) a control signal generator 62 for generating a corrected motor control signal based on inputs from the Faraday cage 50 and the neutral particle detector 52, and (iii) a motor controller 64 which is responsive to the output of the control signal generator 62 to control the motor 49, and thus, the vertical position of disk shaped wafer support 25.

The Faraday cage 50 is comprised of an entry chamber 68, an exit chamber 70 surrounded by magnets 72, and a beam current detection plate 74. As is understood in the art, the ion beam 28 enters the Faraday cage 50 through a slot 56 in the disk shaped wafer support (see FIG. 1). The incident ion beam 28 is characterized by an incident current $I^+$(incident) comprised of components having different charges due to the collisions of the ion beam particles with the residual background gas through which it propagates, which causes electrons to be added to or taken away from the singly charged positive ions. Thus $I^+$(incident)=$I^O+I^-+I^++I^{++}$+etc., wherein $I^O$ is the number of neutral particles per second, $I^-$ is the current of negatively charged ions (one electron excess), $I^+$is the current of singly charged positive ions, and $I^{++}$is the current of doubly charged positive ions (two electrons missing). Of primary importance in determining the dosage of a wafer being implanted by the incident ion beam are the neutral particles and the singly charged ions, and, to a lesser extent, the doubly charged ions. Accordingly, $I^T=I^O+I^++(I^{++})$, wherein $I^T$ stands for the approximate total flux of the implanted ion beam of interest [Eq.1].

Although all three of these components of the ion beam are implanted into the wafer if they possess sufficient energy, the only true indication of implanted dosage as measured by the Faraday cage is represented by its measurement of the singly charged ions $I^+$. The Faraday cage measurement of the doubly charged ions is erroneous because doubly charged ions contribute to dosage only as much as singly charged ions yet are counted twice by the Faraday cage as contributing to ion beam current. Further, neutral particles are not measured by the Faraday cage yet they contribute to dosage as much as singly charged ions. Thus, an ion beam current signal 75 output by the Faraday cage 50 must be compensated to account for doubly charged ions and neutral particles. (The magnets 72 in the Faraday cage provide a suppression mechanism which prevents electrons from entering or leaving the Faraday cage and erroneously contributing to the measured current.)

The neutral particle detector 52 is the mechanism by which such compensation is provided. Although for simplicity the mechanism 52 is referred to only as the neutral particle detector, it also detects singly and doubly charged ions, as described below. The neutral particle detector 54 is integrated within the Faraday cage and comprises an energized deflector plate 78 connected to voltage source 80, and collecting electrodes 82, 84 and 86 for collecting secondary electrons emitted by the target plate 78 and representative of, respectively, neutral particles, singly charged ions, and doubly charged ions.

A sample of the ion beam enters the neutral particle detector 52 through aperture 88 in the Faraday cage exit chamber 70. Thus, a small sample of the ion beam 28 enters the neutral particle detector 52. The voltage source 80, which operates in the range of about twenty percent (20%) of the ion beam acceleration potential, is connected at its positive terminal to ground and at its negative terminal to the deflector plate 78. Accordingly, an electric field E is established within the interior of the neutral fraction detector in the direction of the arrows shown in FIG. 2 (toward deflector plate 78).

The sample portion of the ion beam traverses the electric field created by the negatively biased deflector plate 78. The ionized components of the beam (singly and doubly charged ions) are deflected in the direction of the electric field toward the deflector plate 78 such that they impact the plate. Because the doubly charged ions are more susceptible to the electric field, they impact the deflector plate first, in the area generally designated 92. The singly charged ions are relatively less susceptible to the electric field, and thus they impact the deflector plate generally at location 94. The neutral particles in the ion beam are unaffected by the electric field, and thus impact the deflector plate directly in the line of their travel generally at location 96.

The deflector plate 78 is comprised of graphite and emits secondary electrons when impacted by the singly and doubly charged ions and neutral particles. The rate of secondary electron emission from the deflector plate is independent of the residual background gas pressure and composition. The secondary electrons are accelerated from the surface of the deflector plate 78 at locations 92, 94 and 96 toward collecting electrodes 86, 84 and 82, respectively, which are biased to a positive potential relative to the deflector plate 78 as is known in the art.

The portion of the total beam flux (positive ions and neutral particles) which is provided by neutral particles, and the portion which is provided by doubly charged ions, may then be determined in order to generate a signal 100 which is used to compensate the ion beam current signal 75 output by the Faraday cage 50 to account for the doubly charged ions and neutral particles. The ratio of the secondary electron emission currents collected by the collecting electrodes 82 ($I^O$) and 84 ($I^+$) and 86 ($I^{++}$) (after correction for the unequal secondary electron emission yields) is used to determine the portion of the total beam flux which is provided by singly charged ions, according to the following formula (Eq. 2):

$$\frac{\text{singly charged beam flux}}{\text{total beam flux}} = \frac{I^+}{I^+ + k(I^O)} + k_2(I^{++}) \quad \text{[Eq. 2]}$$

$$\text{wherein } k = \frac{\text{secondary electron yield (corrected) from charged ions}}{\text{secondary electron yield (corrected) from neutral particles}}$$

$$\text{and } k_2 = \frac{\text{secondary emission yield for } I+}{\text{secondary emission yield for } I^{++}}$$

wherein k=secondary electron yield (corrected) from charged ions/secondary electron yield (corrected) from neutral particles and $k_2$=secondary emission yield for I+/secondary emission yield for $I^{++}$ Therefore, referring back to Eq. 1 above $I^T=I^O+I^++I^{++}$, and thus the portion of the beam which is provided by the neutral particles ($I^O$) and doubly charged ions ($I^{++}$) may be determined knowing $I^+$portion which has been determined from Eq. 2 above.

The above calculations are accomplished in the beam current correction factor calculator 98, which, having so determined the extent of ion beam neutralization, provides the correction signal 100 to a beam current adjuster 102. The calculator 98 may be implemented as either logic software or hardware. The beam current adjuster 102 adjusts the ion beam current signal 75 output by the Faraday cage 50 (representing implant dosage) (i) upward, to account for the neutralized particles which do not contribute to the Faraday cage beam current measurement yet which do contribute to dosage, and (ii) downward, to account for the doubly charged ions which only contribute to dosage as much as singly charged ions yet which are counted twice by the Faraday cage as contributing to ion beam current, and outputs a corrected ion beam current signal 104. The motor controller 64 receives the corrected ion beam current signal 104 and outputs a drive control signal 106 to the motor 49 to control the vertical positioning of the disk shaped wafer support 25 (refer back to FIG. 1).

Accordingly, a preferred embodiment of system and method for monitoring and controlling the dopant concentration of an implanted substrate has been described. With the foregoing description in mind, however, it is understood that this description is made only by way of example, that the invention is not limited to the particular embodiments described herein, and that various rearrangements, modifications, and substitutions may be implemented with respect to the foregoing description without departing from the scope of the invention as defined by the following claims and their equivalents.

What I claim is:

1. A neutral particle detector (52) for an ion implantation system (10) for detecting the neutral particle content of an ion beam (28) comprised primarily of neutral particles and positively charged ions, said neutral particle detector (52) comprising:

a deflector plate (78) residing at a negative electrical potential;

a first collecting electrode (82) residing at a positive electrical potential with respect to said deflector plate (78) for collecting secondary electrons emitted by said deflector plate (78) as a result of neutral particles in the ion beam impacting said deflector plate (78); and a second collecting electrode (84) residing at a positive electrical potential with respect to said deflector plate (78) for collecting secondary electrons emitted by said deflector plate (78) as a result of positively charged ions in the ion beam impacting said deflector plate (78), said deflector plate and said collecting electrodes (82, 84) separated by a distance through which the ion beam passes.

2. The neutral particle detector (52) of claim 1, wherein said detector (52) receives only a sample portion of the ion beam (28).

3. The neutral particle detector (52) of claim 1, wherein said positively charged ions in said ion beam (28) comprise singly charged ions and doubly charged ions, and wherein said second collecting electrode (84) collects secondary electrons emitted by said deflector plate (78) as a result of singly charged ions in the ion beam impacting said deflector plate (78), said neutral particle detector (52) further comprising a third collecting electrode (86) residing at a positive electrical potential with respect to said deflector plate (78) for collecting secondary electrons emitted by said deflector plate (78) as a result of doubly charged ions in the ion beam impacting said deflector plate (78), said deflector plate and said collecting electrodes (82, 84, 86) separated by a distance through which the ion beam passes.

4. The neutral particle detector (52) of claim 3, further comprising logic (98) for (i) comparing a first secondary electron emission current collected by said first collecting electrode (82), a second secondary electron emission current collected by said second collecting electrode (84), and a third secondary electron emission current collected by said third collecting electrode (86); and (ii) outputting based on the comparison a correction signal (100) representative of the portion of the beam (28) which is comprised of neutral particles and doubly charged ions.

5. The neutral particle detector (52) of claim 3, wherein said deflector plate (78) is comprised of graphite and said collecting electrodes (82, 84, 86) are comprised of graphite.

6. The neutral particle detector (52) of claim 1, further comprising logic (98) for comparing a first secondary electron emission current collected by said first collecting electrode (82) with a second secondary electron emission current collected by said second collecting electrode (84) to output a correction signal (100) representative of the portion of the beam (28) which is comprised of neutral particles.

7. The neutral particle detector (52) of claim 1, wherein said deflector plate (78) is comprised of graphite and said collecting electrodes (82, 84) are comprised of graphite.

8. A method of determining the neutral particle content of a n ion beam (28) comprised primarily of neutral particles and charged ions, said method comprising the steps of:

passing the ion beam (28) through an electric field established between (i) a deflector plate (78) residing at a negative electrical potential; and (ii) first and second collecting electrodes (82, 84) each residing at a positive electrical potential with respect to said deflector plate (78);

collecting with said first collecting electrode (82) secondary electrons emitted by said deflector plate (78) as a result of neutral particles in the ion beam impacting said deflector plate (78); and collecting with said second collecting electrode (84) secondary electrons emitted by said deflector plate (78) as a result of positively charged ions in the ion beam impacting said deflector plate (78).

9. The method of claim 8, further comprising the initial step of passing the ion beam (28) through an aperture (88) prior to passing the ion beam through said electric field.

10. The method of claim 8, further comprising the steps of:

comparing a first secondary electron emission current collected by said first collecting electrode (82) with a second secondary electron emission current collected by said second collecting electrode (84); and outputting based on the comparison a correction signal (100) representative of the portion of the beam (28) which is comprised of neutral particles.

11. A method of determining the neutral particle content and the doubly charged ion content of an ion beam (28) comprised primarily of neutral particles and singly and doubly positively charged ions, said method comprising the steps of:

passing the ion beam (28) through an electric field established between (i) a deflector plate (78) residing at a negative electrical potential; and (ii) first, second and third collecting electrodes (82, 84, 86) each residing at a positive electrical potential with respect to said deflector plate (78);

collecting with said first collecting electrode (82) secondary electrons emitted by said deflector plate (78) as a result of neutral particles in the ion beam impacting said deflector plate (78);

collecting with said second collecting electrode (84) secondary electrons emitted by said deflector plate (78) as a result of singly charged ions in the ion beam impacting said deflector plate; and collecting with said third collecting electrode (86) secondary electrons emitted by said deflector plate (78) as a result of doubly charged ions in the ion beam impacting said deflector plate.

12. The method of claim 11, further comprising the initial step of passing the ion beam (28) through an aperture (88) prior to passing the ion beam through said electric field.

13. The method of claim 11, further comprising the steps of:

comparing a first secondary electron emission current collected by said first collecting electrode (82), a second secondary electron emission current collected by said second collecting electrode (84), and a third secondary electron emission current collected by said third collecting electrode (86); and outputting based on the comparison a correction signal (100) representative of the portion of the beam (28) which is comprised of neutral particles and doubly charged ions.

14. A dosimetry control system (60) for an ion implantation system (10) in which is generated an ion beam (28) comprised primarily of neutral particles and positively charged ions, comprising:

a beam current measurement device (50) for measuring the electrical current generated by the positively charged ions and outputting an ion beam current signal (74); and a neutral particle detector (52) for detecting the neutral particle content of the ion beam (28), comprising a deflector plate (78) residing at a negative electrical potential; a first collecting electrode (82) residing at a positive electrical potential with respect to said deflector plate (78) for collecting secondary electrons emitted by said deflector plate (78) as a result of neutral particles in the ion beam impacting said deflector plate (78); and a second collecting electrode (84) residing at a positive electrical potential with respect to said deflector plate (78) for collecting secondary electrons emitted by said deflector plate (78) as a result of positively charged ions in the ion beam impacting said deflector plate (78); said deflector plate and said collecting electrodes (82, 84) separated by a distance through which the ion beam passes.

15. The dosimetry control system (60) of claim 14, further comprising an aperture (88) disposed intermediate said beam current measurement device (50) and said neutral particle detector (52).

16. The dosimetry control system (60) of claim 14, wherein said positively charged ions in said ion beam (28) comprise singly charged ions and doubly charged ions, and wherein said second collecting electrode (84) collects secondary electrons emitted by said deflector plate (78) as a result of singly charged ions in the ion beam impacting said deflector plate (78), said neutral particle detector (52) further comprising a third collecting electrode (86) residing at a positive electrical potential with respect to said deflector plate (78) for collecting secondary electrons emitted by said deflector plate (78) as a result of doubly charged ions in the ion beam impacting said deflector plate (78), said deflector plate and said collecting electrodes (82, 84, 86) separated by a distance through which the ion beam passes.

17. The dosimetry control system (60) of claim 16, further comprising logic (98) for (i) comparing a first secondary electron emission current collected by said first collecting electrode (82), a second secondary electron emission current collected by said second collecting electrode (84), and a third secondary electron emission current collected by said third collecting electrode (86); and (ii) outputting a correction signal (100) representative of the portion of the beam (28) which is comprised of neutral particles and doubly charged ions.

18. The dosimetry control system (60) of claim 17, further comprising logic (102) for receiving the correction signal (100) and the ion beam current signal (74) and outputting a corrected ion beam current signal (104).

19. The dosimetry control system (60) of claim 14, further comprising logic (98) for comparing a first secondary electron emission current collected by said first collecting electrode (82) with a second secondary electron emission current collected by said second collecting electrode (84) to output a correction signal (100) representative of the portion of the beam (28) which is comprised of neutral particles.

20. The dosimetry control system (60) of claim 19, further comprising logic (102) for receiving the correction signal (100) and the ion beam current signal (74) and outputting a corrected ion beam current signal (104).

* * * * *